(12) United States Patent
Hua

(10) Patent No.: US 12,095,436 B2
(45) Date of Patent: Sep. 17, 2024

(54) RIPPLE CANCELLATION FOR SWITCHED-CAPACITOR CIRCUIT

(71) Applicant: QUALCOMM Incorporated, San Diego, CA (US)

(72) Inventor: Xingyi Hua, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 361 days.

(21) Appl. No.: 17/457,840

(22) Filed: Dec. 6, 2021

(65) Prior Publication Data

US 2023/0179181 A1  Jun. 8, 2023

(51) Int. Cl.
*H02M 1/14* (2006.01)
*H03H 19/00* (2006.01)

(52) U.S. Cl.
CPC ............ *H03H 19/004* (2013.01); *H02M 1/14* (2013.01)

(58) Field of Classification Search
CPC ........ H02M 1/14; H02M 1/00; H02M 1/0045; H02M 1/15; H02M 3/07; H03H 19/004; H03H 19/00
USPC .................................. 327/327, 538, 543, 551
See application file for complete search history.

(56) References Cited

U.S. PATENT DOCUMENTS

| | | | |
|---|---|---|---|
| 6,438,005 B1 | 8/2002 | Walter | |
| 6,445,623 B1 | 9/2002 | Zhang et al. | |
| 10,298,114 B1 | 5/2019 | Yazdi et al. | |
| 10,938,296 B2 * | 3/2021 | Yazdi | H02M 3/158 |
| 2020/0099291 A1 | 3/2020 | Walter | |

OTHER PUBLICATIONS

International Search Report and Written Opinion—PCT/US2022/050367—ISA/EPO—Mar. 15, 2023.

* cited by examiner

*Primary Examiner* — Hai L Nguyen
(74) *Attorney, Agent, or Firm* — Loza & Loza, LLP

(57) ABSTRACT

In certain aspects, a system includes a voltage line, a switched-capacitor circuit coupled to the voltage line, and a ripple-cancellation circuit. The ripple-cancellation circuit includes a current mirror having a first branch and a second branch, wherein the second branch of the current mirror is coupled to the voltage line, a switching circuit having a first terminal, a second terminal, and a third terminal, wherein the first terminal of the switching circuit is coupled to the first branch of the current mirror, and the third terminal is coupled to a ground or a reference voltage, and a first capacitor coupled to the second terminal of the switching circuit.

16 Claims, 13 Drawing Sheets

FIG. 9

RIPPLE CANCELLATION FOR SWITCHED-CAPACITOR CIRCUIT

BACKGROUND

Field

Aspects of the present disclosure relate generally to switched-capacitor circuits, and more particularly, to ripple cancellation for switched-capacitor circuits.

Background

Various types of circuits may be implemented using switched-capacitor circuits including charge pumps, filters, digital-to-analog converters (DACs), analog-to-digital converters (ADCs), discrete-time signal processors, etc. A switched-capacitor circuit includes one or more capacitors and switches configured to transfer charge to and from the one or more capacitors. The switches may be driven by one or more switching signals (e.g., clock signals).

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a voltage line, a switched-capacitor circuit coupled to the voltage line, and a ripple-cancellation circuit. The ripple-cancellation circuit includes a current mirror having a first branch and a second branch, wherein the second branch of the current mirror is coupled to the voltage line, a switching circuit having a first terminal, a second terminal, and a third terminal, wherein the first terminal of the switching circuit is coupled to the first branch of the current mirror, and the third terminal is coupled to a ground or a reference voltage, and a first capacitor coupled to the second terminal of the switching circuit.

A second aspect relates to a method for reducing ripple on a voltage line coupled to a switched-capacitor circuit. The method includes receiving a switching signal, wherein the switching signal drives one or more switches in the switched-capacitor circuit, generating a current pulse in response to an edge of the switching signal, and injecting the current pulse into the voltage line.

BRIEF DESCRIPTION OF THE DRAWINGS

FIG. 9 shows an exemplary implementation of a current mirror according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
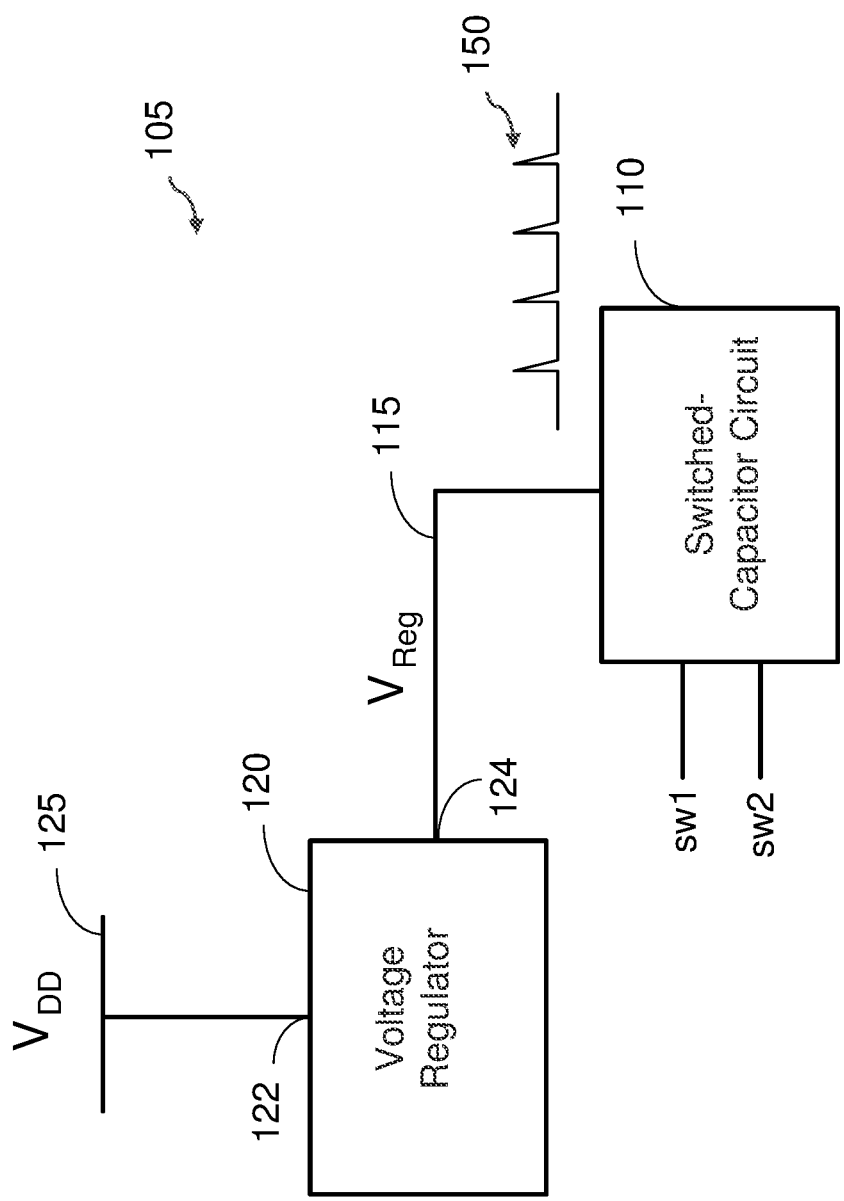
FIG. 1 shows an example of a system including a switched-capacitor circuit according to certain aspects of the present disclosure.

FIG. 1 shows an example of a system 105 including a switched-capacitor circuit 110 and a voltage regulator 120. The switched-capacitor circuit 110 may implement any one of a variety of circuits including a charge pump, a switched-capacitor filter, a digital-to-analog converter (DAC) (e.g., capacitive DAC), an analog-to-digital converter (ADC), a phase-locked loop (PLL), a discrete-time signal processor, a sample and hold circuit, a voltage converter, etc.

The switched-capacitor circuit 110 includes one or more capacitors (not shown) and switches (not shown) configured to transfer charge to and from the one or more capacitors. The switches may be driven by one or more switching signals including a first switching signal (labeled "sw1") and a second switching signal (labeled "sw2"). The first switching signal sw1 may drive one or more of the switches in the switched-capacitor circuit 110 and the second switching signal sw2 may drive other one or more of the switches in the switched-capacitor circuit 110. It is to be appreciated that additional switching signals may be used.

In certain aspects, each of the switching signals sw1 and sw2 may include an oscillating signal (e.g., a clock signal) that oscillates between high (i.e., logic one) and low (logic zero) at an oscillation frequency. In these aspects, the switching signals sw1 and sw2 may be out of phase with each other (e.g., based on a desired switching sequence for the switches in the switched-capacitor circuit 110). For example, the switching signals sw1 and sw2 may be approximately 180 degrees out of phase with each other. However, it is to be appreciated that the present disclosure is not limited to this example. The switching signals sw1 and sw2 may have the same duty cycle or different duty cycles.

The voltage regulator 120 has an input 122 and an output 124. The input 122 is coupled to a supply rail 125, which provides a supply voltage $V_{DD}$. The output 124 is coupled to the switched-capacitor circuit 110 via a voltage line 115 (i.e., the voltage line 115 is coupled between the output 124 and the switched-capacitor circuit 110). The voltage regulator 120 is configured to generate a regulated voltage $V_{Reg}$ from the supply voltage $V_{DD}$ and output the regulated voltage $V_{Reg}$ at the output 124. The voltage line 115 provides the regulated voltage $V_{Reg}$ to the switched-capacitor circuit 110. The voltage regulator 120 may be implemented with a low dropout (LDO) regulator or another type of voltage regulator. An example of an LDO regulator is discussed below with reference to FIG. 2. As used herein, a "voltage line" is a line (e.g., a metal line) used to provide a voltage to one or more circuits coupled to the voltage line, and may also be referred to as a voltage rail, a voltage path, a voltage supply rail, or another term.

A challenge with the switched-capacitor circuit 110 is that the switched-capacitor circuit 110 draws current pulses from the voltage line 115, which causes ripples on the voltage line 115. The ripples may be coupled to the supply rail 125 through the voltage regulator 120 (e.g., due to the limited bandwidth of the voltage regulator 120), and degrade the performance of other circuits (e.g., analog and radio frequency circuits) coupled to the supply rail 125.

The current pulses (represented by current pulses 150 in FIG. 1) are caused by charge transfers from the voltage line 115 to one or more capacitors in the switched-capacitor circuit 110 triggered by switching in the switched-capacitor circuit 110. For example, a current pulse may be triggered when a switch between the voltage line 115 and a capacitor in the switched-capacitor circuit 110 is switched on, allowing charge to flow from the voltage line 115 to the capacitor through the switch. Because the switches in the switched-capacitor circuit 110 are switched on and off by the switching signals sw1 and sw2, each current pulse is triggered on an edge of one of the switching signals sw1 and sw2.

Figure 2:
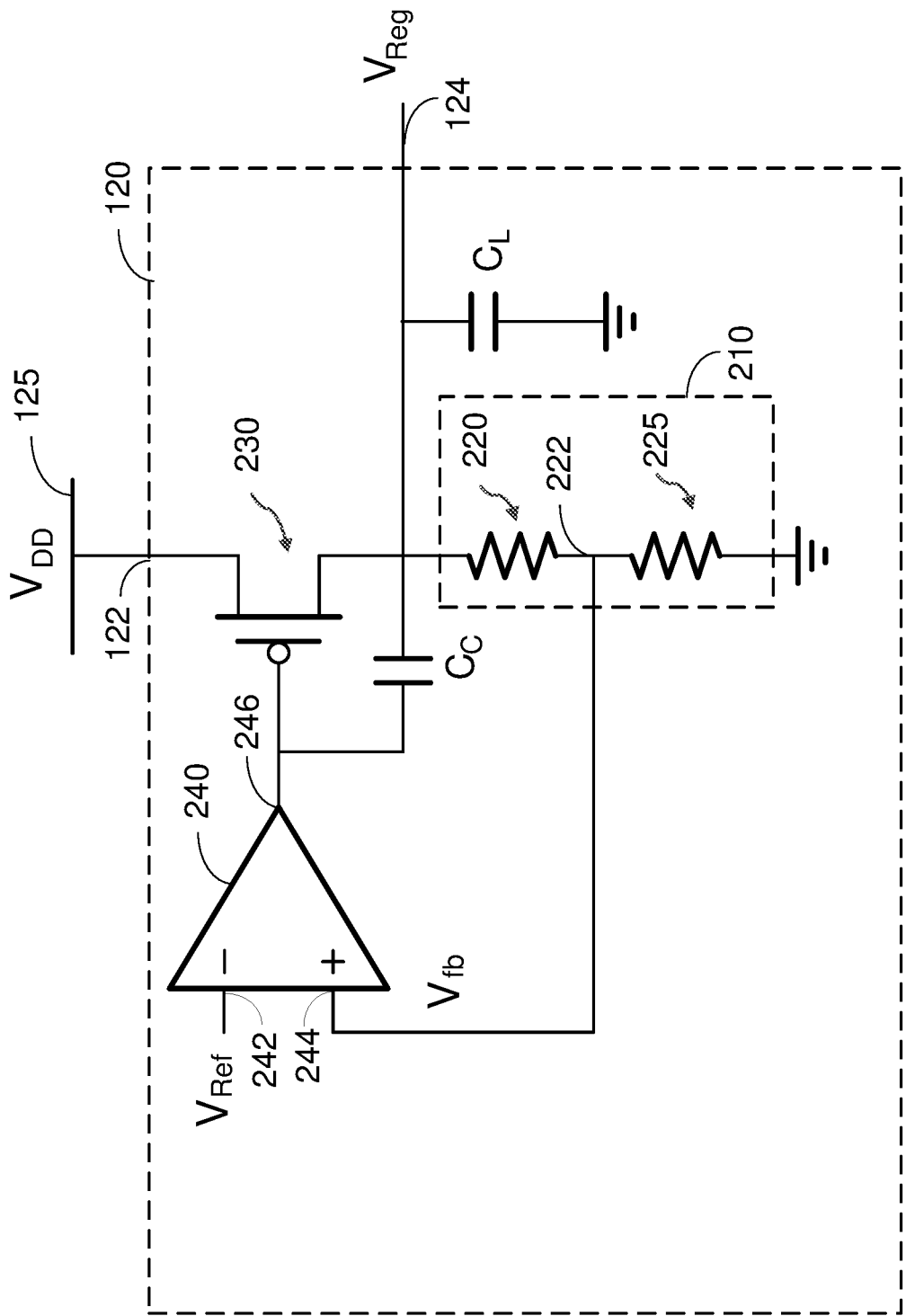
FIG. 2 shows an example of a low-dropout regulator according to certain aspects of the present disclosure.

One approach for reducing the ripple on the voltage line 115 caused by the current pulses employs a large load capacitor coupled to the voltage line 115. An example of this approach is illustrated in FIG. 2, which shows an exemplary implementation of the voltage regulator 120. In this example, the voltage regulator 120 is implemented with an LDO regulator including a pass transistor 230, an error amplifier 240, and a voltage divider 210. The pass transistor 230 is coupled between the input 122 and the output 124, and the voltage divider 210 is coupled between the output 124 and ground. In the example in FIG. 2, the pass transistor 230 is implemented with a p-type field effect transistor (PFET). However, it is to be appreciated that the pass transistor 230 may also be implemented with an n-type field effect transistor (NFET).

In the example in FIG. 2, the voltage divider 210 includes a first resistor 220 and a second resistor 225 coupled in series between the output 124 and ground. The voltage divider 210 generates a feedback voltage $V_{fb}$ at the node 222 between the first resistor 220 and the second resistor 225. The feedback voltage $V_{fb}$ has a voltage given by:

$$V_{fb} = V_{Reg} \cdot \frac{R2}{R1 + R2} \quad (1)$$

where R1 is the resistance of the first resistor 220 and R2 is the resistance of the second resistor 225.

The error amplifier 240 has a first input 242, a second input 244, and an output 246. The first input 242 is configured to receive a reference voltage $V_{Ref}$. The second input 244 is coupled to the node 222 to receive the feedback voltage $V_{fb}$, and the output 246 is coupled to the gate of the pass transistor 230.

In operation, the error amplifier 240 adjusts the gate voltage of the pass transistor 230 in a direction that reduces the difference between the reference voltage $V_{Ref}$ and the feedback voltage $V_{fb}$. This forces the feedback voltage $V_{fb}$ to be approximately equal to the reference voltage $V_{Ref}$, resulting in a regulated voltage $V_{Reg}$ approximately equal to:

$$V_{Reg} = V_{Ref} \cdot \frac{R1 + R2}{R2}. \quad (2)$$

In the example in FIG. 2, the voltage regulator 120 also includes a compensation capacitor $C_C$ coupled between the output 124 and the gate of the pass transistor 230, and a load capacitor $C_L$ coupled to the output 124 (and hence the voltage line 115). In this example, the ripple on the voltage line 115 caused by the current pulses of the switched-capacitor circuit 110 may be reduced by increasing the capacitance of the load capacitor $C_L$. However, increasing the capacitance of the load capacitance $C_L$ pushes the second pole of the voltage regulator 120 to lower frequency, which negatively impacts the stability of the voltage regulator 120. To stabilize the voltage regulator 120 in this case, the impedance of the pass transistor 230 at the output 124 may be reduced by increasing the quiescent current of the voltage regulator 120. The reduced impedance pushes the second pole back to higher frequency. However, increasing the quiescent current of the voltage regulator 120 increases power consumption.

To address this, aspects of the present disclosure provide a ripple-cancellation circuit configured to inject current pulses into the voltage line 115 to cancel the current pulses of the switched-capacitor circuit 110, thereby reducing the ripple on the voltage line 115, as discussed further below.

Figure 3:
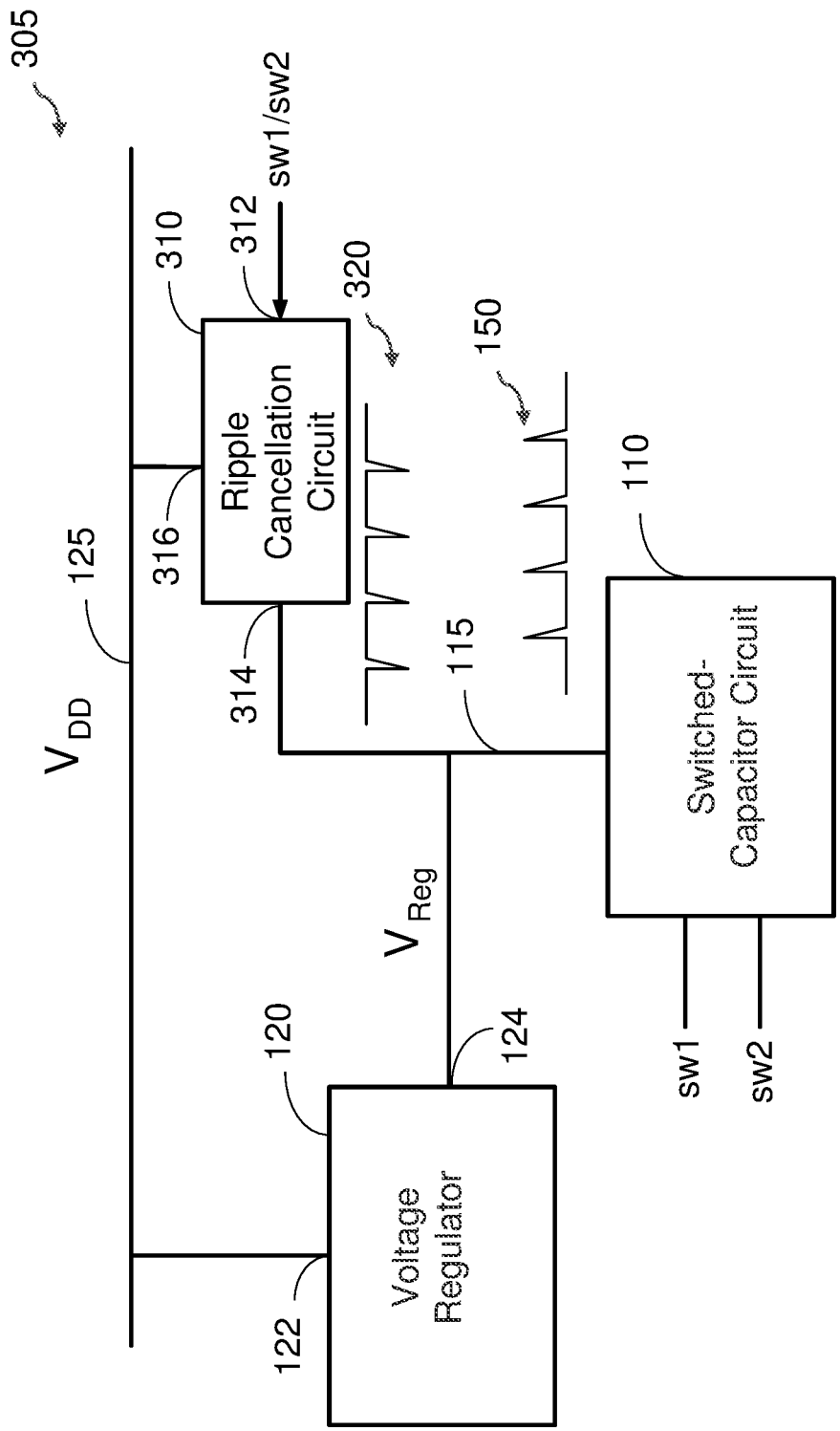
FIG. 3 shows an example of a system including a ripple-cancellation circuit according to certain aspects of the present disclosure.

FIG. 3 shows an example of a system 305 including a ripple-cancellation circuit 310 according to certain aspects of the present disclosure. The system 305 also includes the switched-capacitor circuit 110 and the voltage regulator 120 discussed above with reference to FIG. 1.

The ripple-cancellation circuit 310 has a control input 312, a supply input 316, and an output 314. The supply input 316 may be coupled to the supply rail 125, as shown in the example in FIG. 3. The control input 312 is configured to receive one of the switching signals sw1 and sw2 or both of the switching signals sw1 and sw2. The output 314 is coupled to the voltage line 115.

In certain aspects, the ripple-cancellation circuit 310 is configured to generate current pulses and inject the generated current pulses (represented by current pulses 320 in FIG. 3) into the voltage line 115 via the output 314 to cancel the current pulses (represented by current pulses 150 in FIG. 3) of the switched-capacitor circuit 110. The current pulses of the ripple-cancellation circuit 310 may cancel all of or a portion of the current pulses of the switched-capacitor circuit 110 to reduce the ripple on the voltage line 115.

As discussed above, the current pulses of the switched-capacitor circuit 110 are triggered on edges of one or more of the switching signals sw1 and sw2 since the switching signals sw1 and sw2 control the switches in the switched-capacitor circuit 110. In certain aspects, the ripple-cancellation circuit 310 is configured to time the injection of current pulses into the voltage line 115 on edges of one or more of the switching signals sw1 and sw2. This helps ensure that the current pulses of the ripple-cancellation circuit 310 are approximately time aligned (i.e., synchronized) with the current pulses of the switched-capacitor circuit 110 to cancel the current pulses of the switched-capacitor circuit 110.

Figure 4:
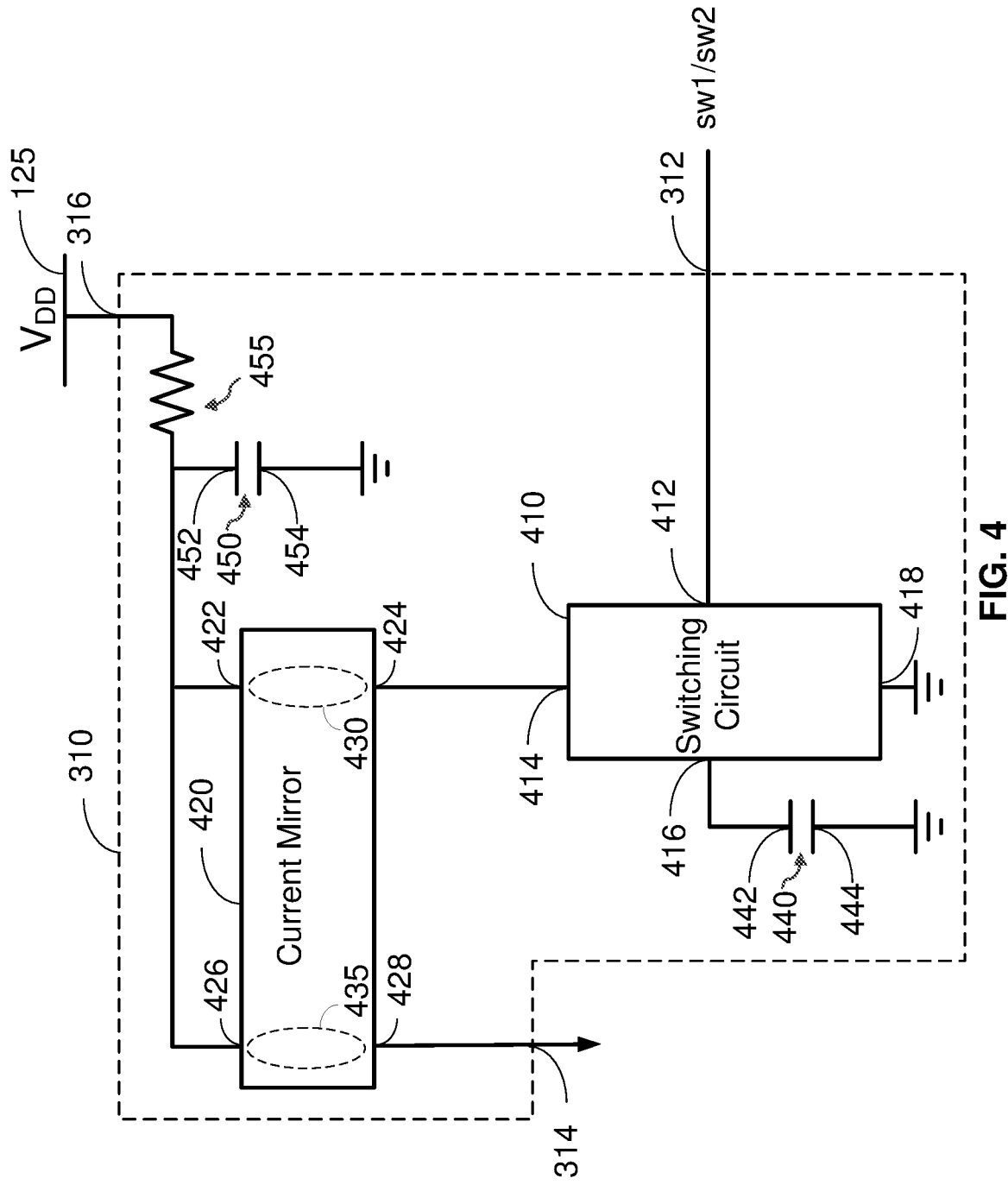
FIG. 4 shows an exemplary implementation of a ripple-cancellation circuit according to certain aspects of the present disclosure.

FIG. 4 shows an exemplary implementation of the ripple-cancellation circuit 310 according to certain aspects. In this example, the ripple-cancellation circuit 310 includes a first capacitor 440, a switching circuit 410, a current mirror 420, a second capacitor 450, and a resistor 455.

The current mirror 420 has a first branch 430 and a second branch 435. The first branch 430 is between a first terminal 422 and a second terminal 424 of the current mirror 420. The second branch 435 is between a third terminal 426 and a fourth terminal 428 of the current mirror 420. The current mirror 420 is configured to mirror the current flowing through the first branch 430 to the second branch 435. In certain aspects, the current mirror 420 may also scale the current flowing through the first branch by a scaling factor of N, as discussed further below.

The second capacitor 450 has a first terminal 452 coupled to the supply rail 125 via the resistor 455 and a second terminal 454 coupled to ground. The second capacitor 450 may receive charge from the supply rail 125 through the resistor 455 and store the charge. The stored charge may be used to provide charge for current pulses generated by the ripple-cancellation circuit 310, as discussed further below. The resistor 455 may be used to attenuate ripples. In the example in FIG. 4, the first terminal 422 and the third terminal 426 of the current mirror 420 are coupled to the first terminal 452 of the second capacitor 450, and the fourth terminal 428 of the current mirror 420 is coupled to the output 314 of the ripple-cancellation circuit 310.

The switching circuit 410 has a control input 412 coupled to the control input 312 of the ripple-cancellation circuit 310. The switching circuit 410 also has a first terminal 414, a second terminal 416, and a third terminal 418. The first terminal 414 is coupled to the second terminal 424 of the current mirror 420, and the third terminal 418 is coupled to ground. The first capacitor 440 may be coupled between the second terminal 416 and ground. More particularly, the first capacitor 440 has a first terminal 442 coupled to the second terminal 416 of the switching circuit 410 and a second terminal 444 coupled to ground. However, it is to be appreciated that the second terminal 444 of the first capacitor 440 and the third terminal 418 of the switching circuit 410 may be coupled to a DC reference voltage in some implementations.

In certain aspects, the switching circuit 410 is configured to receive a switching signal (e.g., one of the switching signals sw1 and sw2) via the control input 412. The switching circuit 410 is configured to couple the second terminal 416 to the third terminal 418 when the switching signal has a first logic state, and to couple the second terminal 416 to the first terminal 414 when the switching signal has a second logic state. The first logic state may be one and the second logic state may be zero, or vice versa. In certain aspects, a logic state of one may correspond to a voltage of approximately $V_{DD}$ or another voltage, and a logic state of zero may correspond to approximately ground.

In this example, the switching circuit 410 couples the first terminal 442 of the first capacitor 440 to ground when the switching signal has the first logic state. As a result, the first capacitor 440 is discharged through the switching circuit 410.

When the switching signal transitions from the first logic state to the second logic state on an edge of the switching signal, the switching circuit 410 couples the first terminal 442 of the first capacitor 440 to the first terminal 414 of the switching circuit 410. This allows charge to flow from the second capacitor 450 to the first capacitor 440 through the current mirror 420 and the switching circuit 410 to charge the first capacitor 440. Thus, the switching circuit 410 triggers charging of the first capacitor 440 on the edge of the switching signal. The edge may be a falling edge for the example where the first logic state is one and the second logic state is zero, and a rising edge for the example where the first logic state is zero and the second logic state is one.

The charging of the first capacitor 440 generates a current pulse having a similar shape (i.e., profile) as a current pulse of the switched-capacitor circuit 110 corresponding to the same edge of the switching signal. This is because the current pulse of the switched-capacitor circuit 110 is also generated by charging of a capacitor.

The current pulse due to charging of the first capacitor 440 flows through the first branch 430 of the current mirror 420, which mirrors (i.e., copies) the current pulse to the second branch 435 of the current mirror 420. The current mirror 420 may also scale the current pulse by the scaling factor N (i.e., the current pulse at the second branch 435 may be N times the current pulse at the first branch 430). The scaling factor may be greater than one.

The current pulse at the second branch 435 of the current mirror 420 is injected into the voltage line 115 (not shown in FIG. 4) via the output 314 to cancel the corresponding current pulse of the switched-capacitor circuit 110. Since both current pulses are triggered by the same edge of the switch signal, the current pulse from the ripple-cancellation circuit 310 is approximately time aligned (i.e., synchronized) with the current pulse of the switched-capacitor circuit 110.

Figure 5:
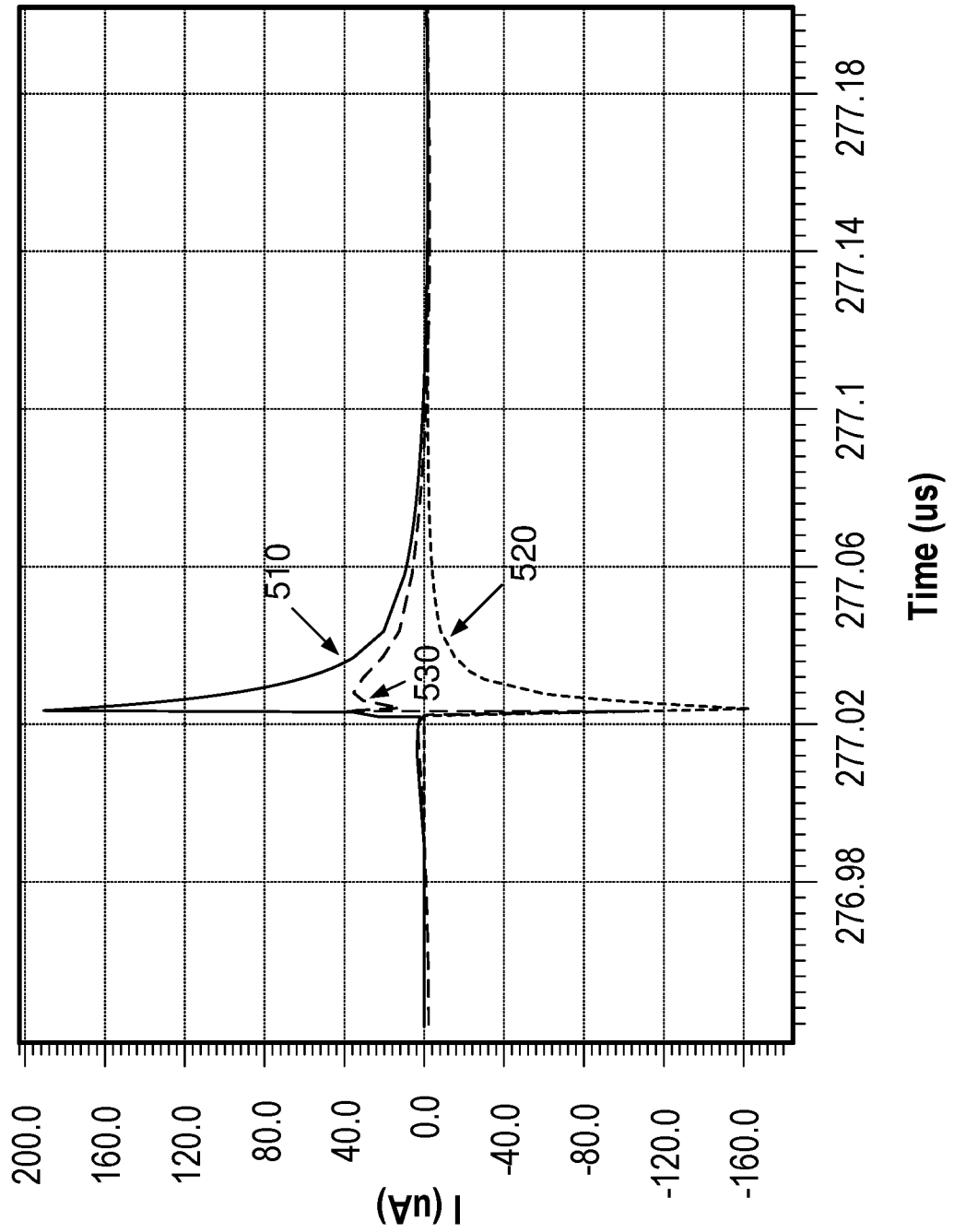
FIG. 5 is a timing diagram illustrating an example of ripple cancellation according to certain aspects of the present disclosure.

FIG. 5 is a diagram showing an example of the current pulse 510 from the switched-capacitor circuit 110 and the current pulse 520 from the ripple-cancellation circuit 310. The current pulses 510 and 520 have opposite polarities in FIG. 5 because the switched-capacitor circuit 110 draws the current pulse 510 from the voltage line 115 and the ripple-cancellation circuit 310 injects the current pulse 520 into the voltage line 115. Also, the current pulses 510 and 520 are approximately time aligned since the current pulses 510 and 520 are triggered by the same edge of the switching signal.

FIG. 5 also shows the net current pulse 530 at the voltage line 115. In the example in FIG. 5, the current pulse 520 from the ripple-cancellation circuit 310 cancels most of the current pulse 510 from the switched-capacitor circuit 110, causing the net current pulse 530 at the voltage line 115 to be substantially smaller than the current pulse 510 from the switched-capacitor circuit 110. As a result, the ripple on the voltage line 115 is substantially reduced.

In certain aspects, the switching signal (e.g., one of the switching signals sw1 and sw2) input to the ripple-cancellation circuit 310 is a clock signal. As used herein, a clock signal is a signal that oscillates between high (i.e., logic one) and low (logic zero) at a clock frequency. In one example, the ripple-cancellation circuit 310 may generate a current pulse and inject the current pulse into the voltage line 115 during each cycle (i.e., period) of the clock signal.

In certain aspects, the system 305 may include multiple instances of the ripple-cancellation circuit 310 coupled to the voltage line 115. In one example, a different switching signal (e.g., different one of the switching signals sw1 and sw2) may be input to each instance of the ripple-cancellation circuit 310. In this example, each instance of the ripple-cancellation circuit 310 may be used to cancel current pulses of the switched-capacitor circuit 110 triggered by edges of the respective switching signal.

Figure 6:
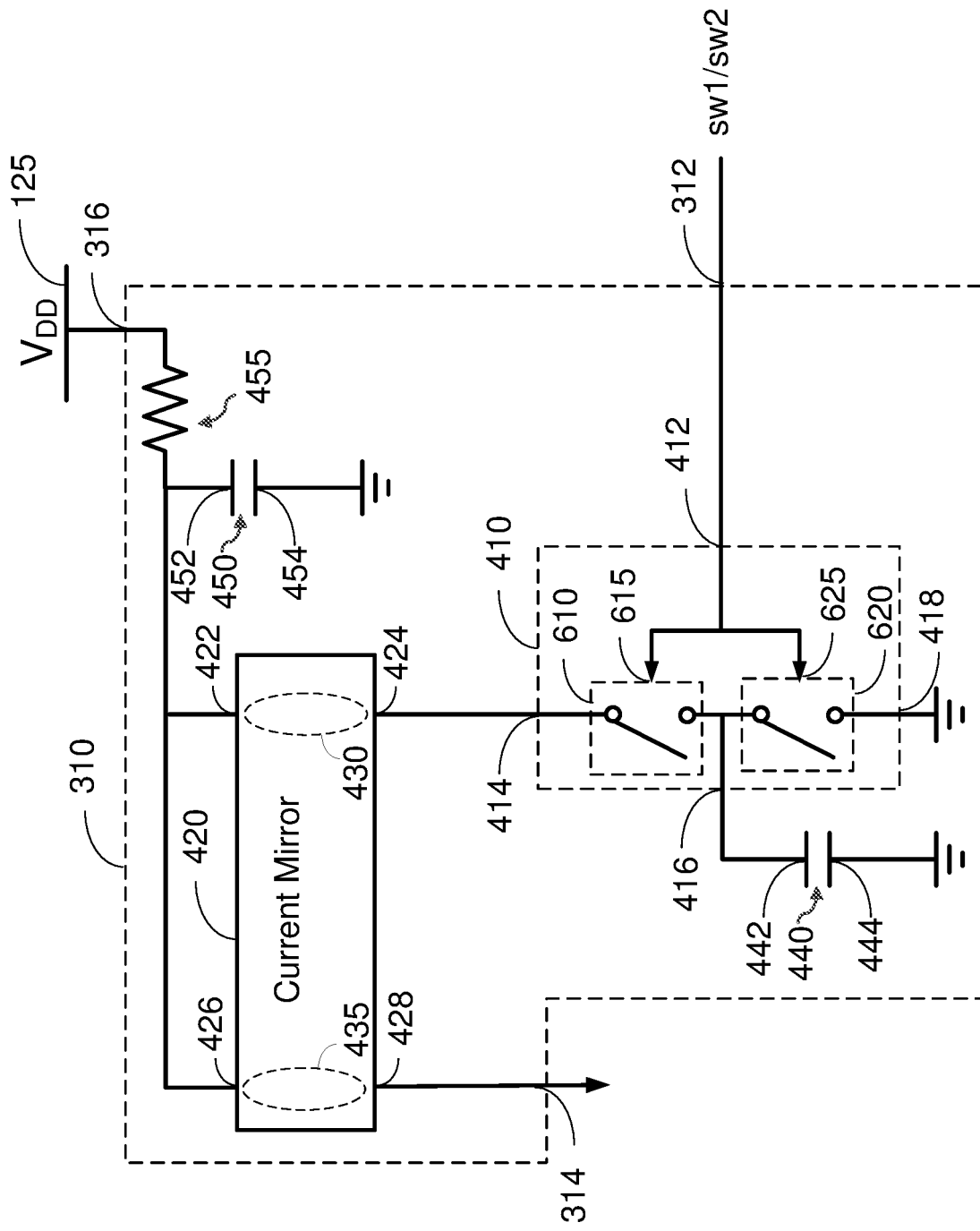
FIG. 6 shows an exemplary implementation of a switching circuit according to certain aspects of the present disclosure.

FIG. 6 shows an exemplary implementation of the switching circuit 410 according to certain aspects of the present disclosure. In this example, the switching circuit 410 includes a first switch 610 and a second switch 620. The first switch 610 is coupled between the first terminal 414 and the second terminal 416, and the second switch 620 is coupled between the second terminal 416 and the third terminal 418.

The first switch 610 has a control input 615 coupled to the control input 412 of the switching circuit 410, and the second switch 620 has a control input 625 coupled to the control input 412 of the switching circuit 410. As used herein, a "control input" of a switch controls the on/off state of the switch based on a signal (e.g., voltage or logic state) at the control input.

In certain aspects, the second switch 620 is configured to turn on when the switching signal at the control input 625 has the first logic state and turn off when the switching signal at the control input 625 has the second logic state. As discussed above, the first logic state may be one and the second logic state may be zero, or vice versa. Thus, in this example, the second switch 620 couples the first terminal 442 of the first capacitor 440 to ground to discharge the first capacitor 440 when the switching signal has the first logic state.

The first switch 610 is configured to turn on when the switching signal at the control input 615 has the second logic state and turn off when the switching signal at the control input 615 has the first logic state. Thus, in this example, the first switch 610 couples the first terminal 442 of the first capacitor 440 to the first terminal 414 of the switching circuit 410 when the switching signal has the second logic state.

When the switching signal transitions from the first logic state to the second logic state on an edge of the switching signal, the first switch 610 switches on. This allows charge to flow from the second capacitor 450 to the first capacitor 440 through the current mirror 420 and the first switch 610 to charge the first capacitor 440. The charging of the first capacitor 440 generates a current pulse, which flows through the first branch 430 of the current mirror 420. The current mirror 420 mirrors (i.e., copies) the current pulse to the second branch 435, which outputs the current pulse at the output 314.

Thus, in this example, the current pulse of the ripple-cancellation circuit 310 is triggered by the switching of the first switch 610 on the edge of the switching signal (e.g., one of the switching signals sw1 and sw2). The edge of the switching signal may be a falling edge for the example where the first logic state is one and the second logic state is zero, and a rising edge for the example where the first logic state is zero and the second logic state is one.

Figure 7:
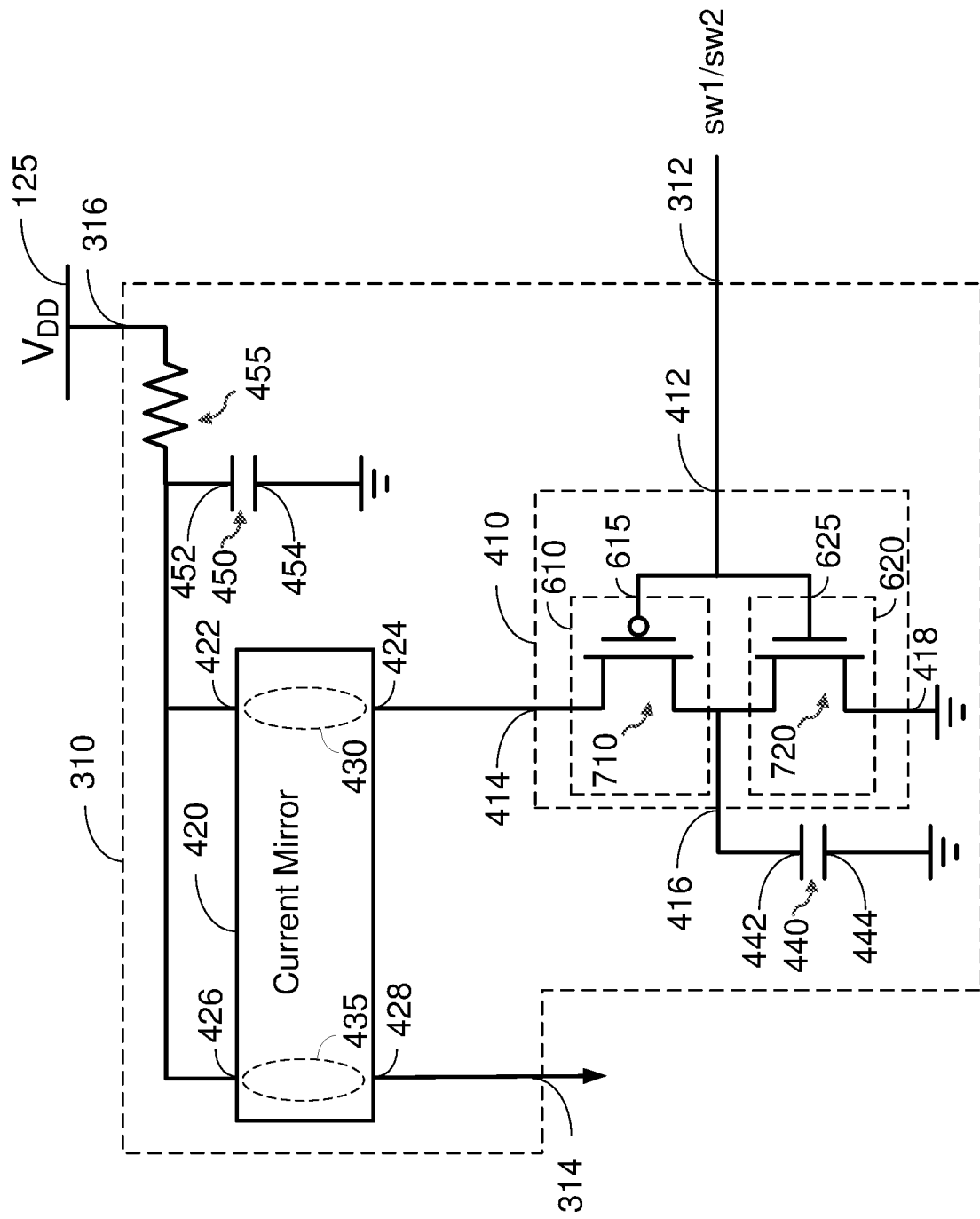
FIG. 7 shows an exemplary implementation of switches in the switching circuit according to certain aspects of the present disclosure.

FIG. 7 shows an exemplary implementation of the first switch 610 and the second switch 620 according to certain aspects. In this example, the first switch 610 includes a p-type field effect transistor (PFET) 710 coupled between the first terminal 414 and the second terminal 416. The control input 615 of the first switch 610 is located at the gate of the PFET 710. The second switch 620 includes an n-type field effect transistor (NFET) 720 coupled between the second terminal 416 and the third terminal 418. The control input 625 of the second switch 620 is located at the gate of the NFET 720.

In this example, the second switch 620 is configured to turn on when the switching signal at the control input 625 is one (e.g., approximately $V_{DD}$) and turn off when the switching signal at the control input 625 is zero. The first switch 610 is configured to turn on when the switching signal at the control input 615 is zero and turn off when the switching signal at the control input 615 is one (e.g., approximately $V_{DD}$).

Thus, in this example, the first switch 610 is switched on when the switching signal transitions from one to zero on a falling edge of the switching signal (e.g., one of the switching signals sw1 and sw2). This allows charge to flow from the second capacitor 450 to the first capacitor 440 through the current mirror 420 and the first switch 610 to charge the first capacitor 440. The charging of the first capacitor 440 generates a current pulse, which flows through the first branch 430 of the current mirror 420. The current mirror 420 mirrors (i.e., copies) the current pulse to the second branch 435, which outputs the current pulse at the output 314.

Figure 8:
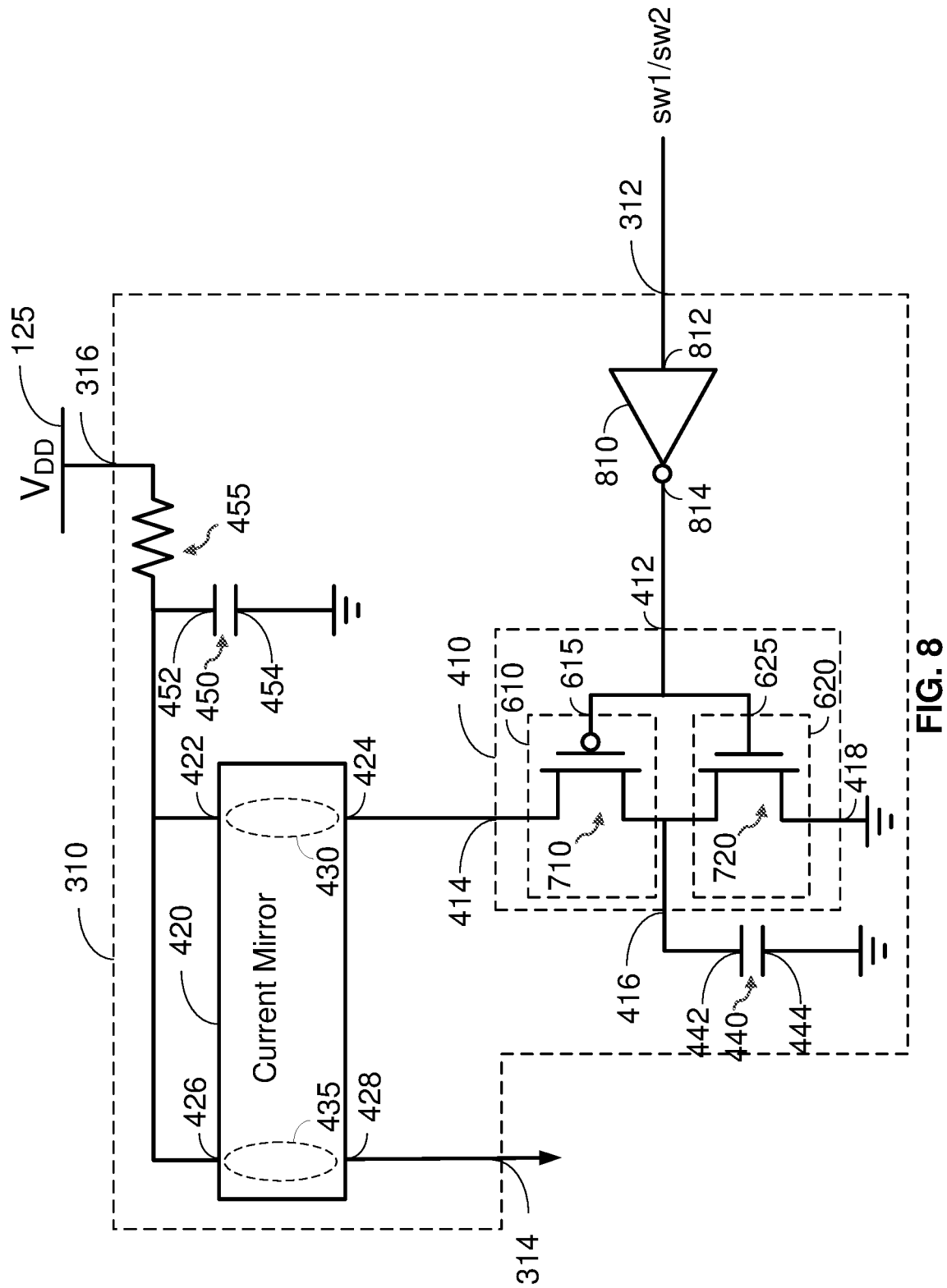
FIG. 8 shows an example of an inverter coupled to the switching circuit according to certain aspects of the present disclosure.

Thus, in this example, the current pulse of the ripple-cancellation circuit 310 is triggered by the switching of the first switch 610 on the falling edge of the switching signal (e.g., one of the switching signals sw1 and sw2). To trigger the current pulse on a rising edge of the switching signal, an inverter 810 may be coupled between the control input 312 of the ripple-cancellation circuit 310 and the control input 412 of the switching circuit 410, an example of which is shown in FIG. 8. In this example, the input 812 of the inverter is coupled to the control input 312 of the ripple-cancellation circuit 310 and the output 814 of the inverter 810 is coupled to the control input 412 of the switching circuit 410. The inverter 810 is configured to invert the switching signal and output the inverted switching signal to the control input 412 of the switching circuit 410. This causes the first switch 610 in the example shown in FIG. 8 to switch on and trigger the current pulse on a rising edge of the switching signal.

Figure 9:
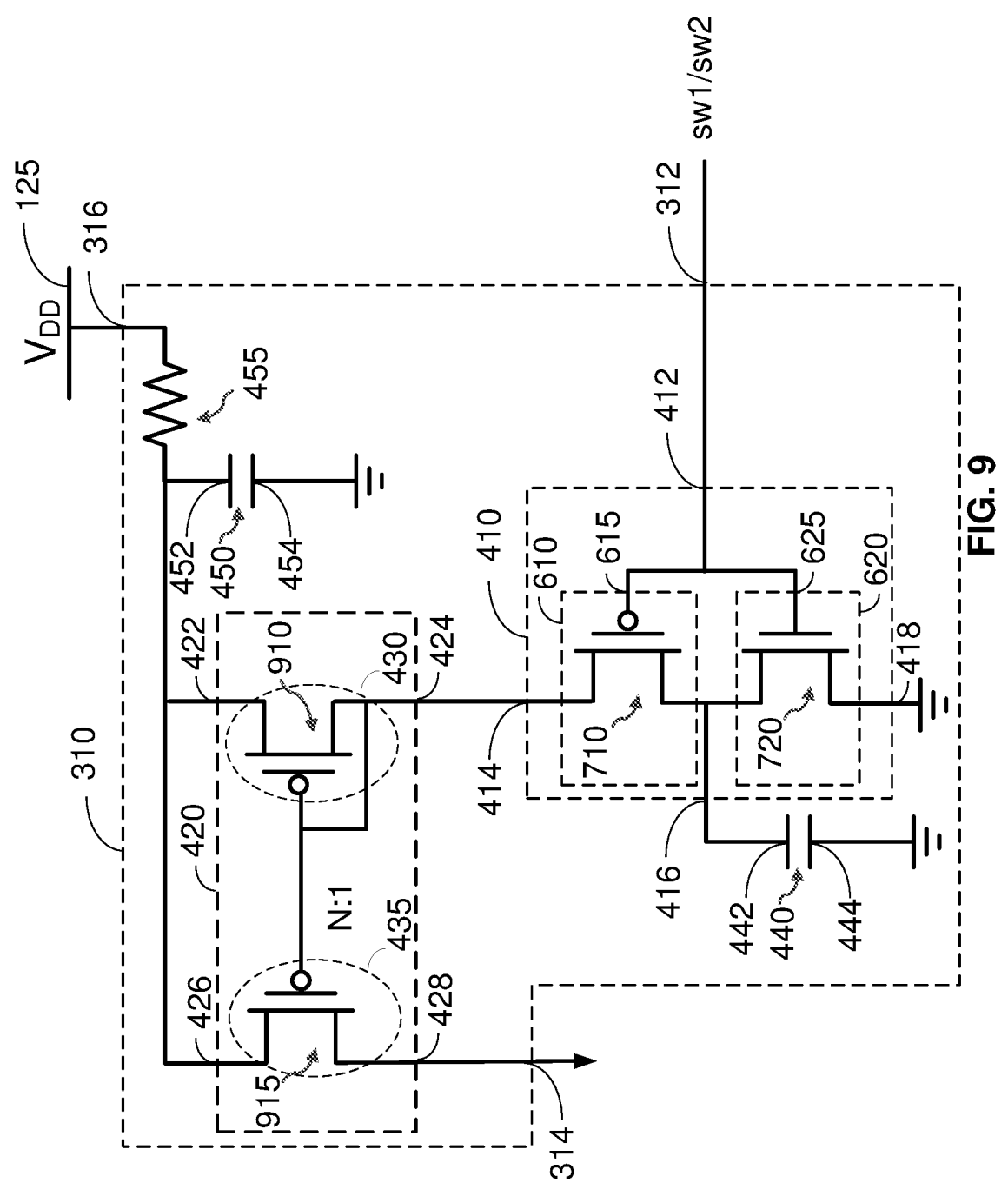

FIG. 9 shows an exemplary implementation of the current mirror 420 according to certain aspects. In this example, the current mirror 420 includes a first transistor 910 and a second transistor 915. The source of the first transistor 910 is coupled to the first terminal 422, the drain of the first transistor 910 is coupled to the second terminal 424, and the gate of the first transistor 910 is coupled to the drain of the first transistor 910. The current of the first branch 430 flows through the channel of the first transistor 910. The source of the second transistor 915 is coupled to the third terminal 426, the drain of the second transistor 915 is coupled to the fourth terminal 428, and the gate of the second transistor 915 is coupled to the gate of the first transistor 910. The current of the second branch 435 flows through the channel of the second transistor 915. In the example in FIG. 9, each of the first transistor 910 and the second transistor 915 is implemented with a respective PFET. However, it is to be appreciated that other types of transistors may be used.

In this example, the source-to-gate voltage of the second transistor 915 is approximately equal to the source-to-gate voltage of the first transistor 910 since the gate of the second transistor 915 is coupled to the gate of the first transistor 910. This causes the second transistor 915 to mirror the current flowing through the first transistor 910.

In certain aspects, the current mirror 420 has a scaling factor N in which the current flowing through the first transistor 910 is scaled by the scaling factor N (i.e., the current flowing through the second transistor 915 is N times the current flowing through the first transistor 910). In these aspects, the second transistor 915 may be sized with respect to the first transistor 910 to achieve the scaling factor N.

In this example, the amount of charge that the ripple-cancellation circuit 310 injects into the voltage line 115 during one current pulse is approximately given by:

$$Q_{rc}=C_{rc}(V_{DD}-V_{th})\cdot N \quad (3)$$

where $Q_{rc}$ is the amount of charge, $C_{rc}$ is the capacitance of the first capacitor 440, $V_{DD}$ is the supply voltage, $V_{th}$ is the threshold voltage of the first transistor 910, and N is the scaling factor of the current mirror 420. In one example, the charge of one current pulse $Q_{rc}$ may be tuned (e.g., by tuning $C_{rc}$ and/or N) such that the charge $Q_{rc}$ closely matches the charge of one current pulse of the switched-capacitor circuit 110 to increase ripple reduction.

Figure 10:
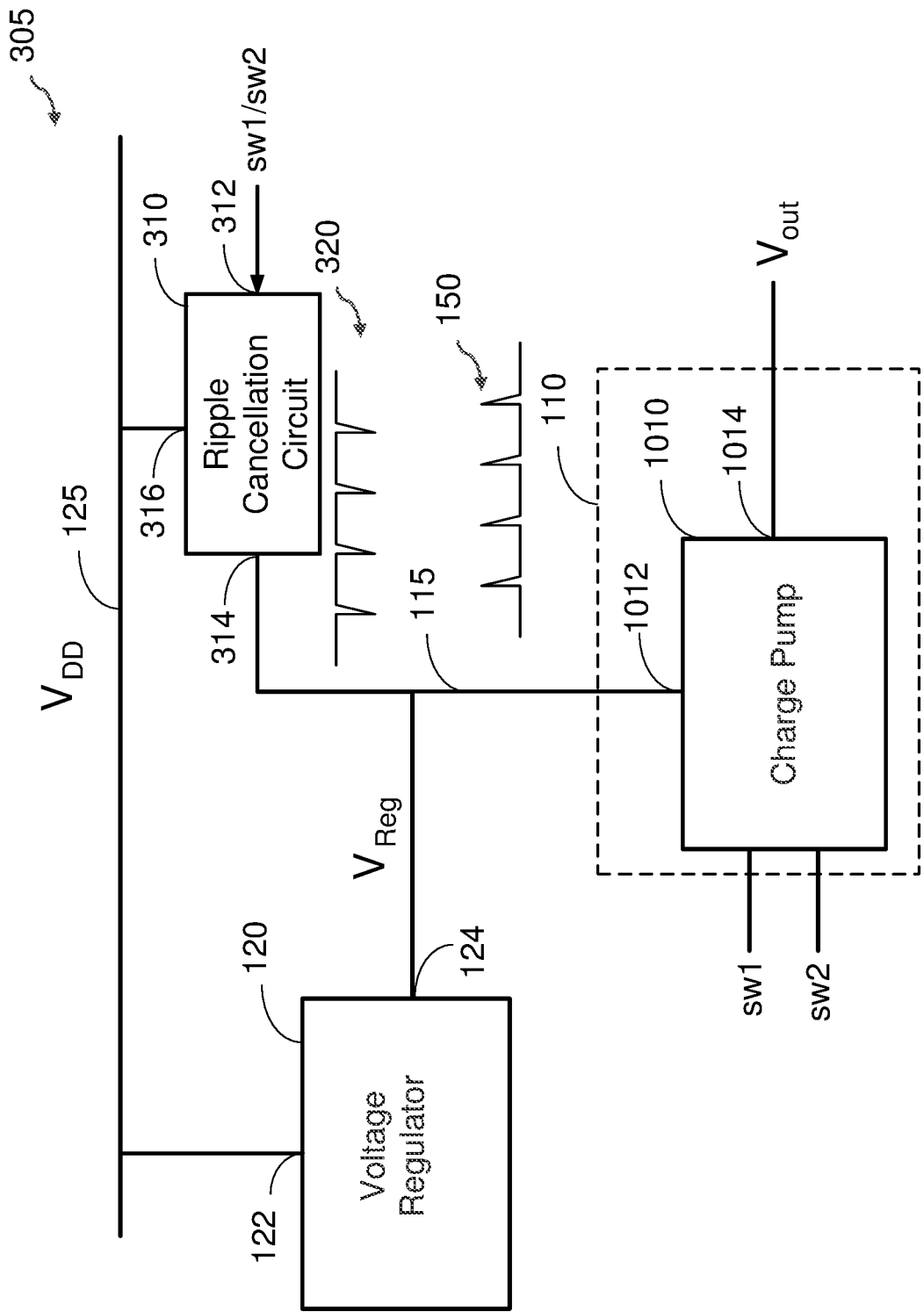
FIG. 10 shows an example of a system including a charge pump according to certain aspects of the present disclosure.

FIG. 10 shows an example in which the switched-capacitor circuit 110 includes a charge pump 1010 according to certain aspects. The charge pump 1010 has an input 1012 coupled to the voltage line 115 and an output 1014. The charge pump 1010 may be configured to convert the voltage at the input 1012 (e.g., $V_{Reg}$) to a lower or higher voltage $V_{out}$ at the output 1014. For example, the charge pump 1010 may double or triple the voltage at the input 1012. In other words, the output voltage $V_{out}$ may be double or triple the voltage at the input 1012. In another example, the charge pump 1010 may invert the voltage at the input 1012. In other words, the output voltage $V_{out}$ may be the negative of the voltage at the input 1012. In another example, the charge pump 1010 may both double or triple the voltage at the input 1012 and invert the voltage at the input 1012 (e.g., $V_{out}=-2V_{Reg}$ or $V_{out}=-3V_{Reg}$). It is to be appreciated that the charge pump 1010 is not limited to the above examples.

Figure 11:
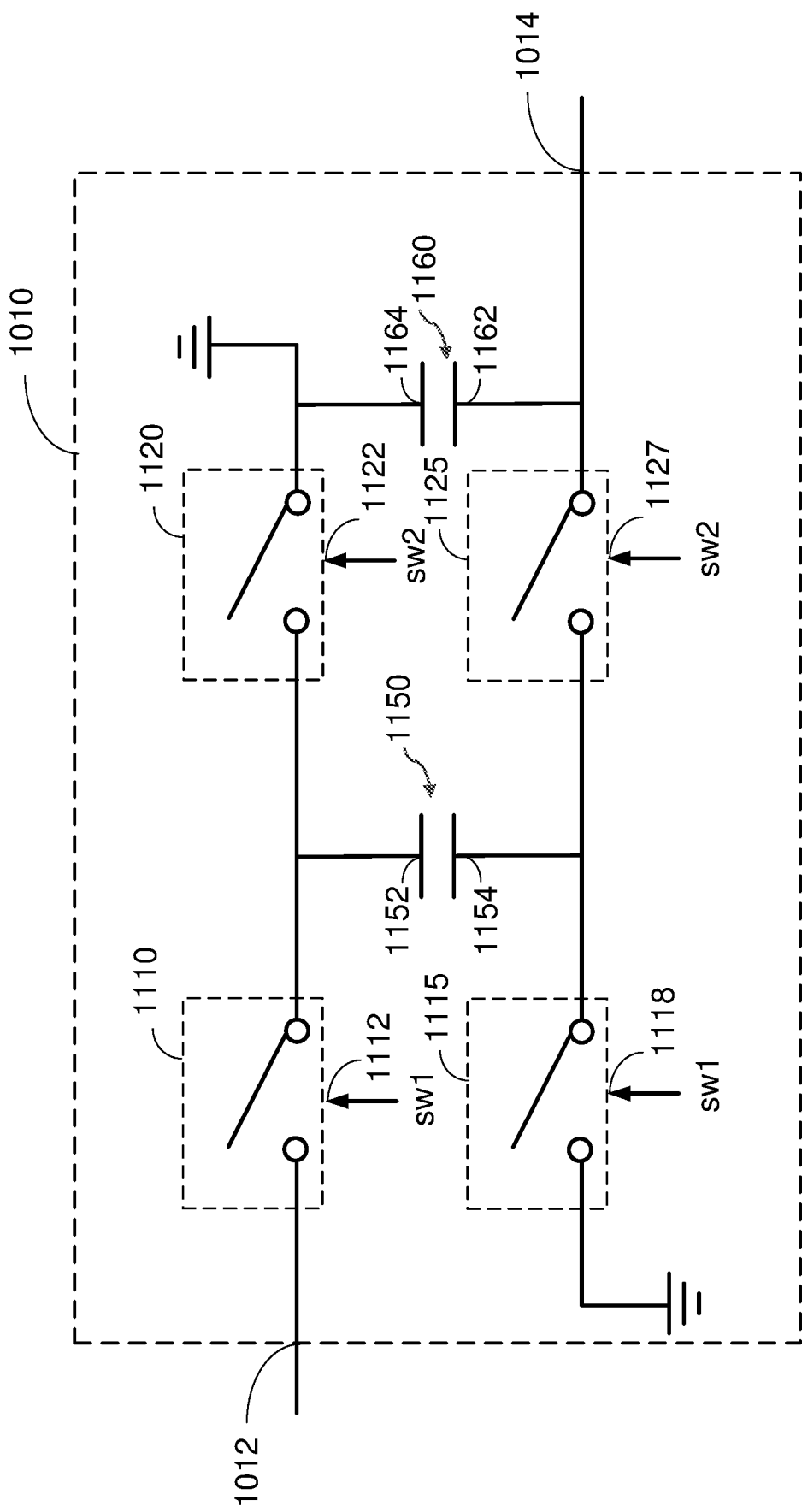
FIG. 11 shows an exemplary implementation of a charge pump according to certain aspects of the present disclosure.

FIG. 11 shows an exemplary implementation of the charge pump 1010 according to certain aspects of the present disclosure. In this example, the charge pump 1010 is configured to invert the voltage at the input 1012.

The charge pump 1010 includes a first switch 1110, a second switch 1115, a third switch 1120, a fourth switch 1125, a first capacitor 1150, and a second capacitor 1160. The first switch 1110 is coupled between the input 1012 and a first terminal 1152 of the first capacitor 1150. The second switch 1115 is coupled between ground and a second terminal 1154 of the first capacitor 1150.

The third switch 1120 is coupled between the first terminal 1152 of the first capacitor 1150 and ground. The fourth switch 1125 is coupled between the second terminal 1154 of the first capacitor 1150 and the output 1014. A first terminal 1162 of the second capacitor 1160 is coupled to the output 1014, and a second terminal 1164 of the second capacitor 1160 is coupled to ground.

The control input 1112 of the first switch 1110 and the control input 1118 of the second switch 1115 may be driven by the first switching signal sw1, and the control input 1122 of the third switch 1120 and the control input 1127 of the fourth switch 1125 may be driven by the second switching signal sw2. In this example, the switching signals sw1 and sw2 may turn on the first switch 1110 and the second switch 1115 and turn off the third switch 1120 and the fourth switch 1125 during a first phase of the charge pump 1010. The switching signals sw1 and sw2 may turn off the first switch 1110 and the second switch 1115 and turn on the third switch 1120 and the fourth switch 1125 during a second phase of the charge pump 1010.

During the first phase, the first switch 1110 couples the first terminal 1152 of the first capacitor 1150 to the input 1012, and the second switch 1115 couples the second terminal 1154 of the first capacitor 1150 to ground. This causes the first capacitor 1150 to charge to a voltage equal to the voltage at the input 1012 (e.g., $V_{Reg}$).

During the second phase, the third switch 1120 couples the first terminal 1152 of the first capacitor 1150 to ground, and the fourth switch 1125 couples the second terminal 1154 of the first capacitor 1150 to the output 1014. This inverts the voltage of the first capacitor 1150 at the output 1014. Since the first capacitor 1150 was charged to the input voltage (e.g., $V_{Reg}$) during the first phase, inverting the voltage of the first capacitor 1150 during the second phase produces a voltage at the output 1014 approximately equal to the negative of the input voltage (e.g., $-V_{Reg}$). The second capacitor 1160 helps hold the negative voltage at the output 1014.

In this example, the switching signals sw1 and sw2 may be periodic signals causing the charge pump 1010 to repeat the first and second phases.

In this example, the charge pump 1010 draws a current pulse from the voltage line 115 when the first switch 1110 switches on. This is because switching on the first switch 1110 allows charge to transfer from the voltage line 115 to the first capacitor 1150 to charge the first capacitor 1150. Since the first switch 1110 is controlled by the first switching signal sw1 in this example, the current pulse is triggered on an edge of the first switching signal sw1. In this example, the first switching signal sw1 may be input to the control input 312 of the ripple-cancellation circuit 310, and the ripple-cancellation circuit 310 may be configured to inject a current pulse into the voltage line 115 on the edge of the first switching signal sw1 to cancel the current pulse of the charge pump 1010. The edge of the first switch signal sw1 may be a rising edge or a falling edge (e.g., depending on whether the first switch signal sw1 is implemented with an NFET or a PFET).

It is to be appreciated that the charge pump 1010 is not limited to the exemplary implementation shown in FIG. 11. In one example, the charge pump 1010 may be configured to double or triple the negative voltage at the output 1014 by adding one or more additional stages to the implementation shown in FIG. 11, where each stage includes switches and a capacitor. For example, the charge pump 1010 may be configured to generate an output voltage $V_{out}$ approximately equal to $-2V_{Reg}$ or $V_{out}=-3V_{Reg}$.

Figure 12:
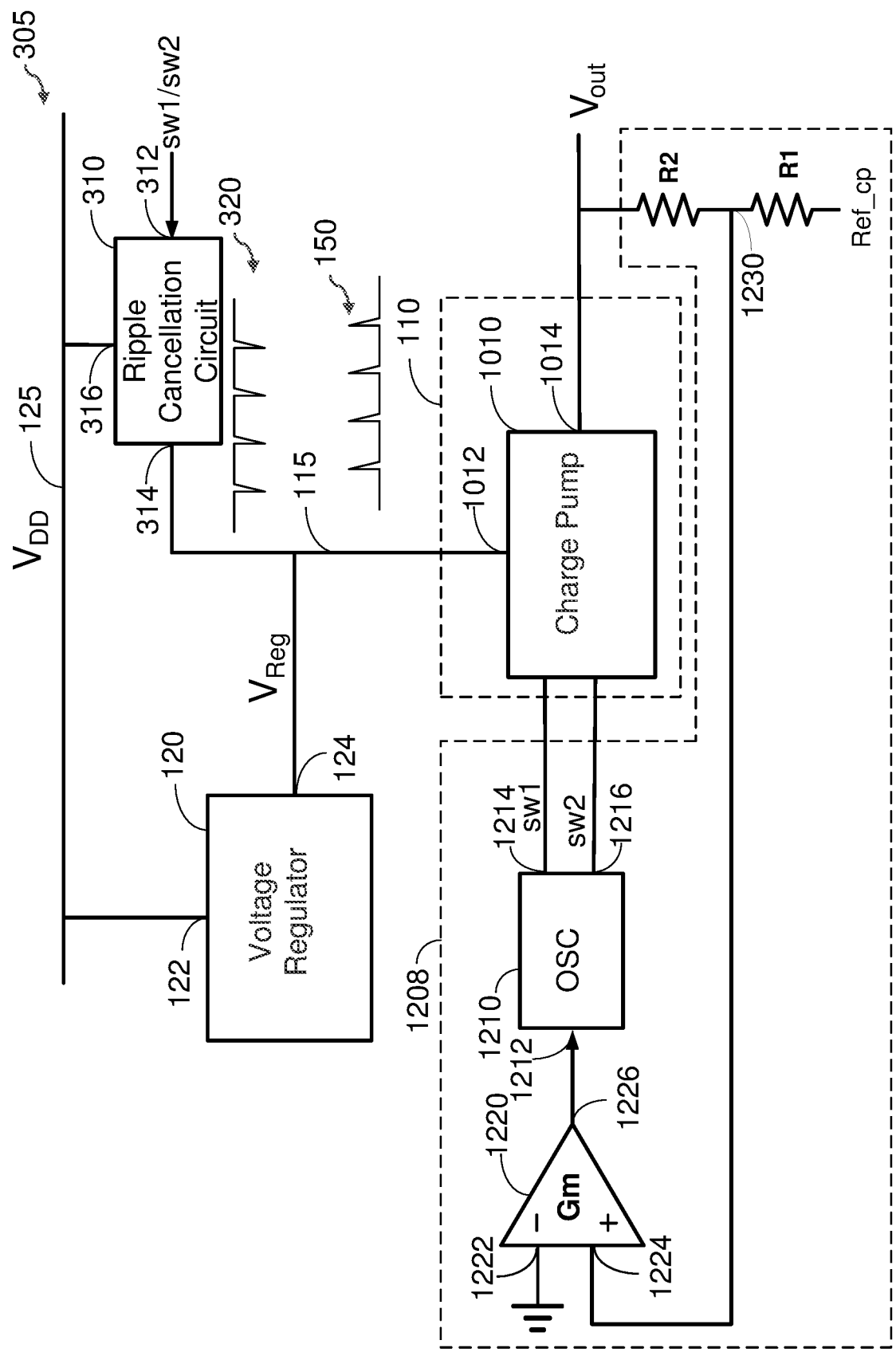
FIG. 12 shows an example of a feedback circuit for a charge pump according to certain aspects of the present disclosure.

In certain aspects, the output voltage $V_{out}$ of the charge pump 1010 may be tuned using a feedback circuit. In this regard, FIG. 12 shows an example of a feedback circuit 1208 including a first resistor R1, a second resistor R2, an amplifier 1220, and an oscillator 1210 according to certain aspects. The first resistor R1 is coupled between node 1230 and a reference voltage Ref_cp, and the second resistor R2 is coupled between the node 1230 and the output 1014 of the charge pump 1010. The amplifier 1220 has a first input 1222 coupled to ground, a second input 1224 coupled to the node 1230, and an output 1226.

The oscillator 1210 has a control input 1212 coupled to the output 1226 of the amplifier 1220, a first output 1214, and a second output 1216. The oscillator 1210 is configured to generate the first switching signal sw1 and the second switching signal sw2, and output the first switching signal sw1 at the first output 1214 and output the second switching signal at the second output 1216. The first output 1214 and the second output 1216 are coupled to the charge pump 1010 to provide the charge pump 1010 with the switching signals sw1 and sw2. The first output 1214 and/or the second output 1216 may also be coupled to the control input 312 of the ripple-cancellation circuit 310 to provide the ripple-cancellation circuit 310 with one or both of the switching signals sw1 and sw2. The oscillator 1210 is also configured to tune a frequency of the first switching signal sw1 and the second switching signal sw2 based on the signal at the output 1226 of the amplifier 1220.

In operation, the amplifier 1220 receives the voltage at the node 1230 via the second input 1224, and adjusts the frequency of the first switching signal sw1 and the second switching signal sw2 in a direction that reduces the difference between the voltage at the node 1230 and ground. In other words, the feedback loop of the feedback circuit 1208 forces the voltage at the node 1230 to be approximately equal to zero volts. This feedback forces the output voltage $V_{out}$ to be approximately equal to:

$$V_{out} = -\frac{R2}{R1} \cdot \text{Ref\_cp} \quad (4)$$

where R1 is the resistance of the first resistor R1, R2 is the resistance of the second resistor R2, and Ref_cp is the reference voltage discussed above. Thus, the feedback circuit 1208 allows the output voltage $V_{out}$ of the charge pump 1010 to be tuned to a desired voltage, for example, by tuning the resistance of the first resistor R1 and/or the resistance of the second resistor R2 accordingly.

Figure 13:
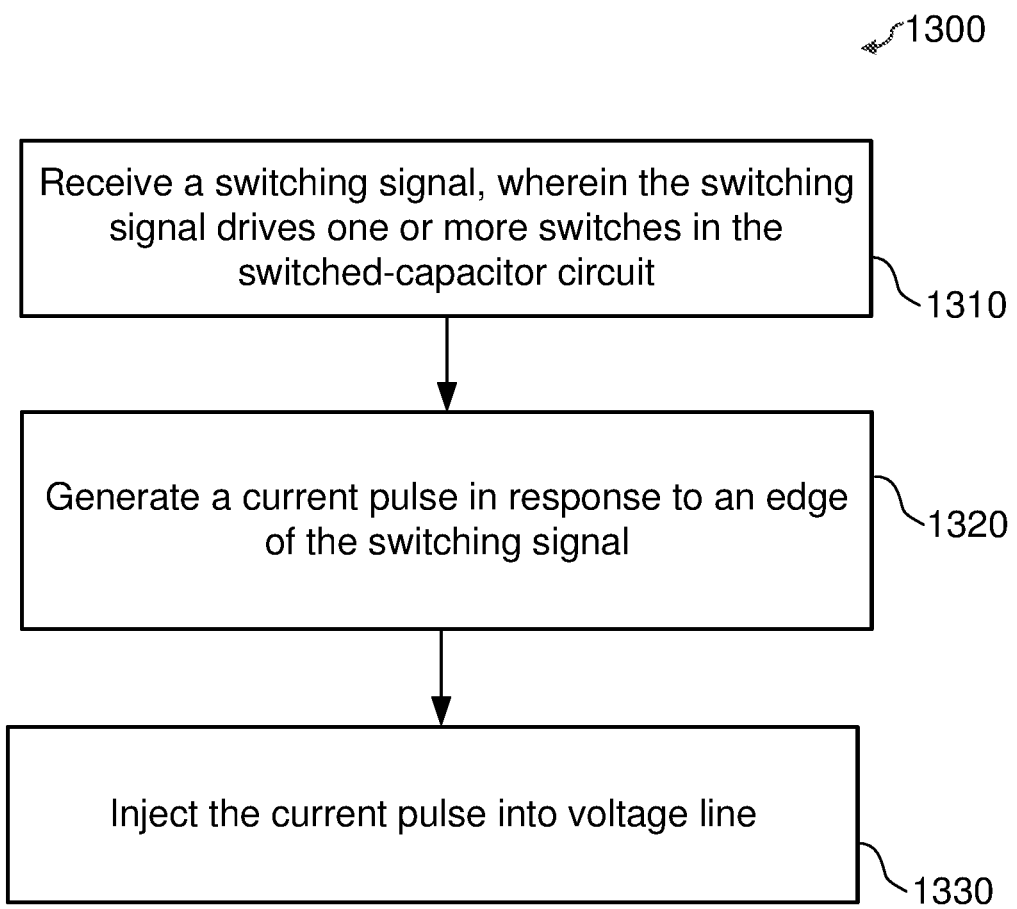
FIG. 13 is a flowchart illustrating a method for reducing ripple according to certain aspects of the present disclosure.

FIG. 13 illustrates an example of a method 1300 for reducing ripple on a voltage line (e.g., voltage line 115) coupled to a switched-capacitor circuit (e.g., switched-capacitor circuit 110) according to certain aspects.

At block 1310, a switching signal is received, wherein the switching signal drives one or more switches in the switched-capacitor circuit. The switching signal may correspond to one of the switching signals sw1 and sw2. The switching signal may be received at the ripple-cancellation circuit 310.

At block 1320, a current pulse is generated in response to an edge of the switching signal. For example, the current pulse may be generated by charging the first capacitor 440. The switching circuit 410 may charge the first capacitor 440 in response to the edge of the switching signal by coupling the second terminal 416 of the switching circuit 410 to the first terminal 414 of the switching circuit 410 on the edge of the switching signal. The edge may be a falling edge or a rising edge.

At block 1330, the current pulse is injected into the voltage line. For example, the current mirror 420 may inject the current pulse into the voltage line.

In certain aspects, injecting the current pulse into the voltage line may include passing the current pulse through a first branch (e.g., first branch 430) of a current mirror (e.g., current mirror 420), wherein the current mirror is configured to mirror the current pulse to a second branch of the current mirror, and injecting the current pulse from the second branch (e.g., second branch 435) of the current mirror into the voltage line. In certain aspects, the current mirror is configured to scale the current pulse by a scaling factor of N, wherein N is greater than one.

In certain aspects, generating the current pulse includes opening a first switch (e.g., the first switch 610) when the switching signal has a first logic state, wherein the first switch is coupled between the first branch of the current mirror and a capacitor (e.g., the first capacitor 440), and closing the first switch when the switching signal has a second logic state, wherein the edge includes a transition from the first logic state to the second logic state. For the example where the first logic state is one and the second logic state is zero, the edge is a falling edge. For the example where the first logic state is zero and the second logic state is one, the edge is a rising edge.

In certain aspects, the method 1300 may also include closing a second switch (e.g., the second switch 620) when the switching signal has the first logic state, wherein the second switch is coupled between the capacitor and a ground or coupled between the capacitor and a reference voltage, opening the second switch when the switching signal has the second logic state.

Implementation examples are described in the following numbered clauses:

1. A system, comprising:
 a voltage line;
 a switched-capacitor circuit coupled to the voltage line; and
 a ripple-cancellation circuit, comprising:
  a current mirror having a first branch and a second branch, wherein the second branch of the current mirror is coupled to the voltage line;
  a switching circuit having a first terminal, a second terminal, and a third terminal, wherein the first terminal of the switching circuit is coupled to the first branch of the current mirror, and the third terminal is coupled to a ground or a reference voltage; and
  a first capacitor coupled to the second terminal of the switching circuit.

2. The system of clause 1, wherein:
 one or more switches in the switched-capacitor circuit are driven by a switching signal; and
 the switching circuit has a control input configured to receive the switching signal.

3. The system of clause 2, wherein the switching circuit is configured to:
 couple the second terminal of the switching circuit to the third terminal of the switching circuit when the switching signal has a first logic state; and
 couple the second terminal of the switching circuit to the first terminal of the switching circuit when the switching signal has a second logic state.

4. The system of clause 2 or 3, wherein the switching circuit comprises:
 a first switch coupled between the second terminal of the switching circuit and the first terminal of the switching circuit, the first switch having a control input coupled to the control input of the switching circuit; and
 a second switch coupled between the second terminal of the switching circuit and the third terminal of the switching circuit, the second switch having a control input coupled to the control input of the switching circuit.

5. The system of clause 4, wherein the first switch comprises a p-type field effect transistor (PFET) and the second switch comprises an n-type field effect transistor (NFET).

6. The system of any one of clauses 1 to 5, wherein the first capacitor has a first terminal and a second terminal, the first terminal of the first capacitor is coupled to the second terminal of the switching circuit, and the second terminal of the first capacitor is coupled to the ground or the reference voltage.

7. The system of any one of clauses 1 to 6, wherein the ripple-cancellation circuit further comprises a resistor coupled between the current mirror and a supply rail.

8. The system of clause 7, wherein the ripple-cancellation circuit further comprises a second capacitor having a first terminal and a second terminal, wherein the first terminal of the second capacitor is coupled between the current mirror and the resistor, and the second terminal of the second capacitor is coupled to the ground.

9. The system of clause 7 or 8, wherein the current mirror comprises:
a first transistor having a source, a drain, and a gate, wherein the source of the first transistor is coupled to the resistor, the gate of the first transistor is coupled to the drain of the first transistor, and the drain of the first transistor is coupled to the first terminal of the switching circuit; and
a second transistor having a source, a drain, and a gate, wherein the source of the second transistor is coupled to the resistor, the gate of the second transistor is coupled to the gate of the first transistor, and the drain of the second transistor is coupled to the voltage line.

10. The system of any one of clauses 1 to 9, further comprising a voltage regulator having an input coupled to a supply rail and an output coupled to the voltage line.

11. The system of clause 10, wherein the voltage regulator comprises a low dropout (LDO) regulator.

12. The system of any one of clauses 1 to 11, wherein the switched-capacitor circuit comprises a charge pump.

13. The system of any one of clauses 1 to 11, wherein the switched-capacitor circuit comprises at least one of a switched-capacitor filter, a digital-to-analog converter (DAC), an analog-to-digital converter (ADC), a phase-locked loop (PLL), a discrete-time signal processor, a sample and hold circuit, or a voltage converter.

14. A method for reducing ripple on a voltage line coupled to a switched-capacitor circuit, the method comprising:
receiving a switching signal, wherein the switching signal drives one or more switches in the switched-capacitor circuit;
generating a current pulse in response to an edge of the switching signal; and
injecting the current pulse into the voltage line.

15. The method of clause 14, wherein generating the current pulse comprises charging a capacitor.

16. The method of clause 14 or 15, wherein injecting the current pulse into the voltage line comprises:
passing the current pulse through a first branch of a current mirror, wherein the current mirror is configured to mirror the current pulse to a second branch of the current mirror; and
injecting the current pulse from the second branch of the current mirror into the voltage line.

17. The method of clause 16, wherein the current mirror is configured to scale the current pulse by a scaling factor of N, and N is greater than one.

18. The method of clause 16 or 17, wherein generating the current pulse comprises:
opening a first switch when the switching signal has a first logic state, wherein the first switch is coupled between the first branch of the current mirror and a capacitor; and
closing the first switch when the switching signal has a second logic state, wherein the edge comprises a transition from the first logic state to the second logic state.

19. The method of clause 18, further comprising:
closing a second switch when the switching signal has the first logic state, wherein the second switch is coupled between the capacitor and a ground or coupled between the capacitor and a reference voltage; and
opening the second switch when the switching signal has the second logic state.

20. The method of any one of clauses 14 to 19, wherein the edge of the switching signal is a rising edge.

21. The method of any one of clauses 14 to 19, wherein the edge of the switching signal is a falling edge.

22. The method of any one of clauses 14 to 21, wherein the switched-capacitor circuit comprises a charge pump.

23. The method of any one of clauses 14 to 21, wherein the switched-capacitor circuit comprises at least one of a switched-capacitor filter, a digital-to-analog converter (DAC), an analog-to-digital converter (ADC), a phase-locked loop (PLL), a discrete-time signal processor, a sample and hold circuit, or a voltage converter.

It is to be appreciated that a transistor described herein may be physically implemented on a chip with multiple transistors coupled in parallel.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property (i.e., within 90% to 110% of the stated value or property).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
a voltage line;
a switched-capacitor circuit coupled to the voltage line; and
a ripple-cancellation circuit, comprising:
a current mirror having a first branch and a second branch, wherein the second branch of the current mirror is coupled to the voltage line;
a switching circuit having a first terminal, a second terminal, and a third terminal, wherein the first terminal of the switching circuit is coupled to the first branch of the current mirror, and the third terminal is coupled to a ground or a reference voltage; and
a first capacitor coupled to the second terminal of the switching circuit, wherein the first capacitor has a first terminal and a second terminal, the first terminal of the first capacitor is coupled to the second terminal of the switching circuit, and the second terminal of the first capacitor is coupled to the ground or the reference voltage.

2. The system of claim 1, wherein:
one or more switches in the switched-capacitor circuit are driven by a switching signal; and
the switching circuit has a control input configured to receive the switching signal.

3. The system of claim 2, wherein the switching circuit is configured to:
couple the second terminal of the switching circuit to the third terminal of the switching circuit when the switching signal has a first logic state; and
couple the second terminal of the switching circuit to the first terminal of the switching circuit when the switching signal has a second logic state.

4. The system of claim 2, wherein the switching circuit comprises:
a first switch coupled between the second terminal of the switching circuit and the first terminal of the switching circuit, the first switch having a control input coupled to the control input of the switching circuit; and
a second switch coupled between the second terminal of the switching circuit and the third terminal of the switching circuit, the second switch having a control input coupled to the control input of the switching circuit.

5. The system of claim 4, wherein the first switch comprises a p-type field effect transistor (PFET) and the second switch comprises an n-type field effect transistor (NFET).

6. A system, comprising:
a voltage line;
a switched-capacitor circuit coupled to the voltage line; and
a ripple-cancellation circuit, comprising:
a current mirror having a first branch and a second branch, wherein the second branch of the current mirror is coupled to the voltage line,
a switching circuit having a first terminal, a second terminal, and a third terminal, wherein the first terminal of the switching circuit is coupled to the first branch of the current mirror, and the third terminal is coupled to a ground or a reference voltage,
a first capacitor coupled to the second terminal of the switching circuit, and
a resistor coupled between the current mirror and a supply rail.

7. The system of claim 6, wherein the ripple-cancellation circuit further comprises a second capacitor having a first terminal and a second terminal, wherein the first terminal of the second capacitor is coupled between the current mirror and the resistor, and the second terminal of the second capacitor is coupled to the ground.

8. The system of claim 6, wherein the current mirror comprises:
a first transistor having a source, a drain, and a gate, wherein the source of the first transistor is coupled to the resistor, the gate of the first transistor is coupled to the drain of the first transistor, and the drain of the first transistor is coupled to the first terminal of the switching circuit; and a second transistor having a source, a drain, and a gate, wherein the source of the second transistor is coupled to the resistor, the gate of the second transistor is coupled to the gate of the first transistor, and the drain of the second transistor is coupled to the voltage line.

9. A system, comprising:
a voltage line;
a switched-capacitor circuit coupled to the voltage line;
a ripple-cancellation circuit, comprising:
a current mirror having a first branch and a second branch, wherein the second branch of the current mirror is coupled to the voltage line,
a switching circuit having a first terminal, a second terminal, and a third terminal, wherein the first terminal of the switching circuit is coupled to the first branch of the current mirror, and the third terminal is coupled to a ground or a reference voltage, and
a first capacitor coupled to the second terminal of the switching circuit; and
a voltage regulator having an input coupled to a supply rail and an output coupled to the voltage line.

10. The system of claim 9, wherein the voltage regulator comprises a low dropout (LDO) regulator.

11. The system of claim 9, wherein the switched-capacitor circuit comprises a charge pump.

12. The system of claim 9, wherein the switched-capacitor circuit comprises at least one of a switched-capacitor filter, a digital-to-analog converter (DAC), an analog-to-digital converter (ADC), a phase-locked loop (PLL), a discrete-time signal processor, a sample and hold circuit, or a voltage converter.

13. The system of claim 9, wherein:
one or more switches in the switched-capacitor circuit are driven by a switching signal; and
the switching circuit has a control input configured to receive the switching signal.

14. The system of claim 13, wherein the switching circuit is configured to:
couple the second terminal of the switching circuit to the third terminal of the switching circuit when the switching signal has a first logic state; and
couple the second terminal of the switching circuit to the first terminal of the switching circuit when the switching signal has a second logic state.

15. The system of claim 13, wherein the switching circuit comprises:
a first switch coupled between the second terminal of the switching circuit and the first terminal of the switching circuit, the first switch having a control input coupled to the control input of the switching circuit; and
a second switch coupled between the second terminal of the switching circuit and the third terminal of the switching circuit, the second switch having a control input coupled to the control input of the switching circuit.

16. The system of claim 15, wherein the first switch comprises a p-type field effect transistor (PFET) and the second switch comprises an n-type field effect transistor (NFET).

* * * * *